(12) United States Patent
Nam et al.

(10) Patent No.: US 10,754,382 B2
(45) Date of Patent: Aug. 25, 2020

(54) DISPLAY DEVICE

(71) Applicant: Samsung Display Co., Ltd., Yongin-Si, Gyeonggi-Do (KR)

(72) Inventors: Hyunsuk Nam, Seoul (KR); Mingu Kim, Seoul (KR); Hansun Ryou, Seoul (KR); Mansik Myeong, Seoul (KR); Dongjin Park, Seongnam-si (KR); Hyoyul Yoon, Seoul (KR); Kyoungah Lee, Seoul (KR); Sungchul Choi, Hwaseong-si (KR)

(73) Assignee: SAMSUNG DISPLAY CO., LTD., Gyeonggi-Do (KR)

( * ) Notice: Subject to any disclaimer, the term of this patent is extended or adjusted under 35 U.S.C. 154(b) by 0 days.

(21) Appl. No.: 16/423,283

(22) Filed: May 28, 2019

(65) Prior Publication Data

US 2020/0057471 A1 Feb. 20, 2020

(30) Foreign Application Priority Data

Aug. 14, 2018 (KR) .................. 10-2018-0094766

(51) Int. Cl.
*G06F 1/16* (2006.01)
*H05K 5/00* (2006.01)

(52) U.S. Cl.
CPC .......... *G06F 1/1641* (2013.01); *G06F 1/1616* (2013.01); *G06F 1/1652* (2013.01); *H05K 5/0017* (2013.01)

(58) Field of Classification Search
CPC .... G06F 1/1616; G06F 1/1641; G06F 1/1652; G06F 9/00; H01L 27/32; H05K 5/0017
See application file for complete search history.

(56) References Cited

U.S. PATENT DOCUMENTS

| | | | |
|---|---|---|---|
| 6,377,324 B1 * | 4/2002 | Katsura | G02F 1/133305 349/58 |
| 6,577,496 B1 * | 6/2003 | Gioscia | G06F 1/1616 345/156 |
| 9,348,369 B2 | 5/2016 | Kee et al. | |
| 10,074,824 B2 | 9/2018 | Han et al. | |
| 2006/0050169 A1 * | 3/2006 | Misawa | G06F 1/1616 348/333.06 |
| 2006/0146488 A1 * | 7/2006 | Kimmel | G06F 1/1616 361/679.04 |
| 2011/0148797 A1 * | 6/2011 | Huitema | G06F 1/1652 345/173 |

(Continued)

FOREIGN PATENT DOCUMENTS

| | | |
|---|---|---|
| KR | 1020140142004 A | 12/2014 |
| KR | 101834793 B1 | 2/2018 |
| KR | 1020180036904 A | 4/2018 |

*Primary Examiner* — Dmitriy Bolotin
(74) *Attorney, Agent, or Firm* — Cantor Colburn LLP (57) ABSTRACT

A display device includes a display module including a plurality of non-folding portions arranged along a first direction, and a folding portion disposed between the non-folding portions; a support part facing each of the non-folding portions and the folding portion; an adhesive between the support part and each of the non-folding portions, respectively; and a sub-support part between the folding portion and the support part. Along a second direction crossing the first direction, a first width of the sub-support part is less than a second width of the display module.

20 Claims, 8 Drawing Sheets

(56) References Cited

U.S. PATENT DOCUMENTS

| | | | |
|---|---|---|---|
| 2012/0033354 A1* | 2/2012 | Huang | G09F 9/301 |
| | | | 361/679.01 |
| 2013/0010405 A1* | 1/2013 | Rothkopf | H04M 1/0216 |
| | | | 361/679.01 |
| 2017/0033313 A1* | 2/2017 | Kim | H01L 33/52 |
| 2017/0142847 A1* | 5/2017 | Park | G06F 1/1616 |
| 2018/0138442 A1* | 5/2018 | Kim | G06F 3/041 |
| 2018/0150108 A1* | 5/2018 | Song | H05K 1/028 |
| 2019/0171315 A1* | 6/2019 | Park | G06F 3/0412 |

\* cited by examiner

DISPLAY DEVICE

This U.S. non-provisional patent application claims priority under 35 U.S.C. § 119 of Korean Patent Application No. 10-2018-0094766, filed on Aug. 14, 2018, the entire contents of which are hereby incorporated by reference.

BACKGROUND

(1) Field

The present disclosure herein relates to a display device, and more particularly, to a display device capable of reducing a deformation amount of a folding part of a display module.

(2) Description of the Related Art

In general, electronic devices for providing an image to a user, such as smartphones, digital cameras, laptop computers, navigation devices and smart televisions, include a display device for displaying the image. The display device generates an image to provide the generated image to the user through a display screen.

As technologies of the display device are developed, various types of display devices have been developed. For example, a flexible display device that is deformable, foldable and rollable into a curved shape has been developed. The flexible display device may be highly portable and improve a user's convenience in using such device.

SUMMARY

The present disclosure provides a display device capable of reducing a variation amount of a folding part of a display module relative to an initial form thereof.

An embodiment of the invention provides a display device including:

a display module including a plurality of non-folding portions which are arranged along a first direction, and a folding portion which is disposed between the non-folding portions and at which the display module is folded; a support part disposed facing each of the non-folding portions and the folding portion of the display module; an adhesive disposed between the support part and each of the non-folding portions of the display module, respectively; and a sub-support part disposed between the folding portion of the display module and the support part. Along a second direction crossing the first direction, a first width of the sub-support part is less than a second width of the display module.

In an embodiment of the invention, a display device includes: a display module including a plurality of non-folding portions arranged along a first direction, and a folding portion which is disposed between the non-folding portions and at which the display module is folded; a support part disposed facing each of the non-folding portions and the folding portion of the display module; an adhesive disposed between the support part and each of the non-folding portions, respectively; and a sub-support part disposed between the folding portion and the support part. Along a second direction crossing the first direction, the sub-support part defines a first end and a second end which is opposite to the first end, and the display module at the folding portion thereof defines a first end and a second end respectively corresponding to the first end and the second end of the sub-support part, and the first and second ends of the sub-support part are respectively spaced apart from the corresponding first and second ends of the display module at the folding portion thereof to define grooves between the folding portion of the display module and the support part respectively at each of the first and second ends of the sub-support part.

BRIEF DESCRIPTION OF THE DRAWINGS

The accompanying drawings are included to provide a further understanding of the invention, and are incorporated in and constitute a part of this specification. The drawings illustrate exemplary embodiments of the invention and, together with the description, serve to explain principles of the invention. In the drawings.

DETAILED DESCRIPTION

It will be understood that when an element such as a region, layer, or portion is referred to as being related to another element such as being "on" another element, it can be directly on the other element or intervening elements may also be present. In contrast, when an element such as a region, layer, or portion is referred to as being related to another element such as being "directly on" another element, no other element or intervening elements are present.

Like reference numerals refer to like elements throughout. Also, in the drawings, the thicknesses, ratios, and dimensions of components are exaggerated for clarity of illustration.

It will be understood that when an element is referred to as being related to another element such as being "on" another element, it can be directly on the other element or intervening elements may be present therebetween. In contrast, when an element is referred to as being related to another element such as being "directly on" another element, there are no intervening elements present.

The terminology used herein is for the purpose of describing particular embodiments only and is not intended to be limiting. As used herein, the singular forms "a," "an," and "the" are intended to include the plural forms, including "at least one," unless the content clearly indicates otherwise. "At least one" is not to be construed as limiting "a" or "an." As used herein, the term "and/or" includes any and all combinations of one or more of the associated listed items.

It will be understood that although the terms of first and second are used herein to describe various elements, these elements should not be limited by these terms. The terms are only used to distinguish one component from other components. For example, a first element referred to as a first element in one embodiment can be referred to as a second element in another embodiment. The terms of a singular form may include plural forms unless referred to the contrary.

Also, spatially relative terms, such as "below," "lower," "above," "upper" and the like may be used herein for ease of description to describe an element and/or a feature's relationship to another element(s) and/or feature(s) as illustrated in the drawings. The terms are relative concepts and described with respect to the direction indicated in the drawings.

"About" or "approximately" as used herein is inclusive of the stated value and means within an acceptable range of deviation for the particular value as determined by one of ordinary skill in the art, considering the measurement in question and the error associated with measurement of the particular quantity (i.e., the limitations of the measurement system). For example, "about" can mean within one or more standard deviations, or within ±30%, 20%, 10% or 5% of the stated value.

Unless otherwise defined, all terms (including technical and scientific terms) used herein have the same meaning as generally understood by those skilled in the art. Terms as defined in a commonly used dictionary should be construed as having the same meaning as in an associated technical context, and unless defined apparently in the description, the terms are not ideally or excessively construed as having formal meaning.

The meaning of 'include' or 'comprise' specifies a property, a region, a fixed number, a step, a process, an element and/or a component but does not exclude other properties, regions, fixed numbers, steps, processes, elements and/or components.

Exemplary embodiments are described herein with reference to cross section illustrations that are schematic illustrations of idealized embodiments. As such, variations from the shapes of the illustrations as a result, for example, of manufacturing techniques and/or tolerances, are to be expected. Thus, embodiments described herein should not be construed as limited to the particular shapes of regions as illustrated herein but are to include deviations in shapes that result, for example, from manufacturing. For example, a region illustrated or described as flat may, typically, have rough and/or nonlinear features. Moreover, sharp angles that are illustrated may be rounded. Thus, the regions illustrated in the figures are schematic in nature and their shapes are not intended to illustrate the precise shape of a region and are not intended to limit the scope of the present claims.

In the case of a folding display device, a folding part of the display device may be deformed by an operation of folding or unfolding the display device. As the operation of folding or unfolding is repeated, a variation in a structure, dimension, etc. of the folding part may undesirably increase as compared to an original structure or dimension of the folding part.

Hereinafter, embodiments of the invention will be described in detail with reference to the accompanying drawings.

Figure 1:
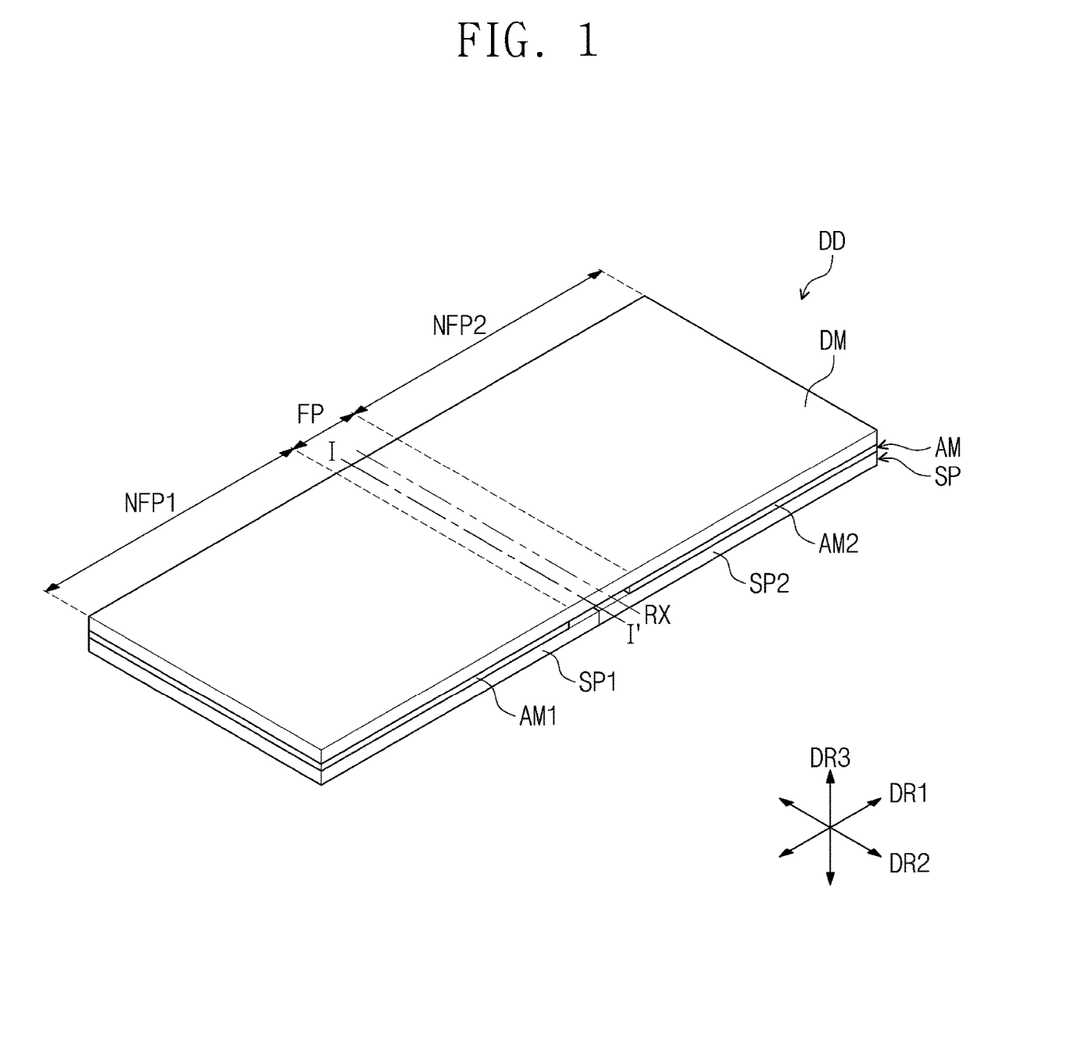
FIG. 1 is a perspective view illustrating an embodiment of a display device according to the invention.

FIG. 1 is a perspective view of an embodiment of a display device according to the invention Referring to FIG. 1, a display device DD may have an overall rectangular shape having relatively long sides lengthwise extended in a first direction DR1 and relatively short sides lengthwise extended in a second direction DR2 crossing the first direction DR1. The display device DD may include a display module DM, a support part (or member) SP disposed below the display module DM, and a fixing layer such as an adhesive AM disposed between the display module DM and the support part SP along a third direction DR3 crossing each of the first and second directions DR1 and DR2.

The display module DM may have an overall rectangular shape having relatively long sides lengthwise extended in the first direction DR1 and relatively short sides lengthwise extended in the second direction DR2. However, the invention is not limited thereto. In other embodiments, for example, the display module DM may have various shapes. Hereinafter, a direction that crosses a plane defined by the first and second directions DR1 and DR2 is defined as the third direction DR3. The third direction DR3 may be substantially perpendicular to the plane defined by the first and second directions DR1 and DR2, but is not limited thereto.

The display module DM may have surfaces disposed in a plane parallel to a plane defined by the first and second directions DR1 and DR2. The display module DM may have a top surface that is defined as a display surface for providing an image to a user. The display module DM may generate an image, and the generated image may be provided to the user through the display surface.

The display module DM may include a plurality of non-folding parts (or portions) NFP1 and NFP2 arranged in the first direction DR1, and a folding part (or portion) FP disposed between the non-folding parts NFP1 and NFP2. The display device DD and various components or layers thereof, may be bendable or foldable at the folding part FP, and may not be foldable or bending at a respective non-folding part NFP1 or NFP2. Although two non-folding parts NFP1 and NFP2 and one folding part FP are exemplarily illustrated, the invention is not limited to the number of each of the non-folding parts NFP1 and NFP2 and the folding part FP described above. In an embodiment, for example, the display module DM may include more than two non-folding parts and a plurality of folding parts disposed between the non-folding parts.

The non-folding parts NFP1 and NFP2 may include a first non-folding part NFP1 and a second non-folding part NFP2. Although not shown in FIG. 1 due to the display module DM, a sub-support part may be disposed between the first non-folding part NFP1 and the second non-folding part NFP2 and below the folding part FP. The sub-support part will be described below in detail with reference to FIGS. 4 and 5.

Each of the first and second non-folding parts NFP1 and NFP2 may maintain a flat state, and the folding part FP may be folded with respect to a bending or rotation axis RX that overlaps the folding part FP and is parallel to the second direction DR2. The first and second non-folding parts NFP1 and NFP2 may maintain a flat state even when the overall display device DD and other various components or layers thereof are bent or folded at the folding part FP. A reason of the folding part FP being folded will be described below in detail with reference to FIG. 6.

The support part SP may be disposed below the display module DM to support the display module DM. The support part SP may include a first support part SP1 and a second support part SP2, which are arranged in the first direction DR1.

The first support part SP1 may overlap the first non-folding part NFP1 and a predetermined portion of the folding part FP which is adjacent to the first non-folding part NFP1. The second support part SP2 may overlap the second non-folding part NFP2 and a predetermined portion of the folding part FP which is adjacent to the second non-folding part NFP2.

In an embodiment, for example, the first support part SP1 and the second support part SP2 may be disposed at left and right sides with respect to a center of the folding part FP, where the left and right sides are oriented along the first direction DR1. However, the invention is not limited thereto. In another embodiment, for example, the first support part SP1 and the second support part SP2 may be disposed at left and right sides with respect to a predetermined portion of the folding part FP, where the predetermined portion is disposed offset from the center of the folding part FP.

The adhesive AM may be disposed between each of the non-folding parts NFP1 and NFP2, and the support part SP, along the third direction DR3. The adhesive AM may attach the non-folding parts NFP1 and NFP2 to the first and second support parts SP1 and SP2, respectively.

The adhesive AM may include a first adhesive AM1 disposed between the first non-folding part NFP1 and the first support part SP1, and a second adhesive AM2 disposed between the second non-folding part NFP2 and the second support part SP2. The first adhesive AM1 may attach the first non-folding part NFP1 to the first support part SP1. The second adhesive AM2 may attach the second non-folding part NFP2 to the second support part SP2. Referring to FIG. 1, the first and second adhesives AM1 and AM2 may be disconnected from each other at the folding part FP of the display module DM, such that a gap is formed between the first and second adhesives AM1 and AM2 at the folding part FP.

Figure 2:
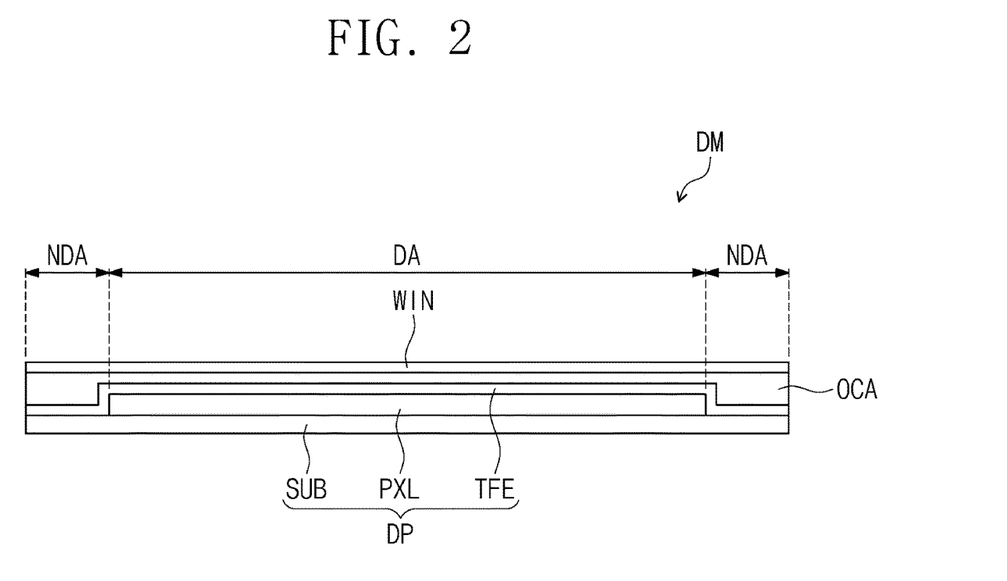
FIG. 2 is a schematic cross-sectional view illustrating an embodiment of a display module in the display device of FIG. 1.

FIG. 2 is a schematic cross-sectional view illustrating an embodiment of the display module in the display device of FIG. 1.

Referring to FIG. 2, the display module DM may include a display panel DP, a window WIN disposed on the display panel DP, and an adhesive OCA disposed between the display panel DP and the window WIN. The display panel DP may be an organic light emitting display panel. However, the invention is not limited thereto. In an embodiment, for example, various display panels, which are capable of displaying an image, such as a liquid crystal display panel, an electrowetting display panel, and an electrophoretic display panel may be used as the display panel DP. The window WIN may form an outer surface of the display module DM (and the display device DD) through which an image is transmitted and viewable to outside the display device DD.

The display panel DP may include a substrate SUB, a pixel layer PXL disposed on the substrate SUB, and a thin-film encapsulation layer TFE disposed on the substrate SUB to cover the pixel layer PXL. The substrate SUB, which is a transparent substrate, may include a plastic substrate, a glass substrate, or an organic/inorganic composite substrate.

The substrate SUB may include a flexible plastic substrate to have flexibility. However, the invention is not limited thereto. In an embodiment, for example, the substrate SUB may include a glass substrate, so as to be relatively rigid.

The substrate SUB may include a display area DA at which an image is displayed and a non-display area NDA at which the image is not displayed. The display device DD and various components or layers thereof may include a display area and a non-display area corresponding to those described for the substrate SUB. The non-display area NDA may be disposed around the display area DA in a top plan view, but is not limited thereto. The pixel layer PXL may be disposed on the display area DA. The pixel layer PXL may include a plurality of pixels, and each of the pixels may include a light emitting element. The pixel layer PXL and elements thereof may be controlled or driven to generate and/or display an image.

The thin-film encapsulation layer TFE may include at least two inorganic layers and an organic layer which is disposed between the inorganic layers. Each of the inorganic layers may contain an inorganic material and protect the pixel layer PXL from moisture and/or oxygen. The organic layer may include an organic material and protect the pixel layer PXL from undesirable foreign substances such as dust particles.

Although the thin-film encapsulation layer TFE for protecting the pixel layer PXL is exemplarily illustrated, the invention is not limited thereto. In an embodiment, for example, an encapsulation substrate (e.g., an encapsulating glass) may be used to protect the pixel layer PXL. The encapsulation substrate may be disposed on the substrate SUB, and the pixel layer PXL may be disposed between the encapsulation substrate and the substrate SUB. The encapsulation substrate may be bonded to the substrate SUB such as through a sealing member disposed on the non-display area NDA.

The encapsulation substrate may include a synthetic resin substrate or a glass substrate. The sealing member may include an inorganic adhesive such as frit. However, the invention is not limited thereto. In an embodiment, for example, the sealing member may include an organic adhesive. Since the pixel layer PXL may be sealed from outside the display module by the encapsulation substrate and the sealing member, damage to the light emitting element within the pixel layer PXL due to moisture may be reduced or effectively prevented.

The window WIN may protect the display panel DP from external scratches and impacts. The window WIN may be attached to the display panel DP by the adhesive OCA. The adhesive OCA may include an optical clear adhesive.

An image generated from the display panel DP may pass through the window WIN and be provided to the user located outside the display device DD. Although not shown, a plurality of touch sensing units may be disposed between the window WIN and the display panel DP. The touch sensing units may sense external touches (e.g., hands of the user or a touch pen) to the display device DD and various components or layers thereof.

Figure 3:
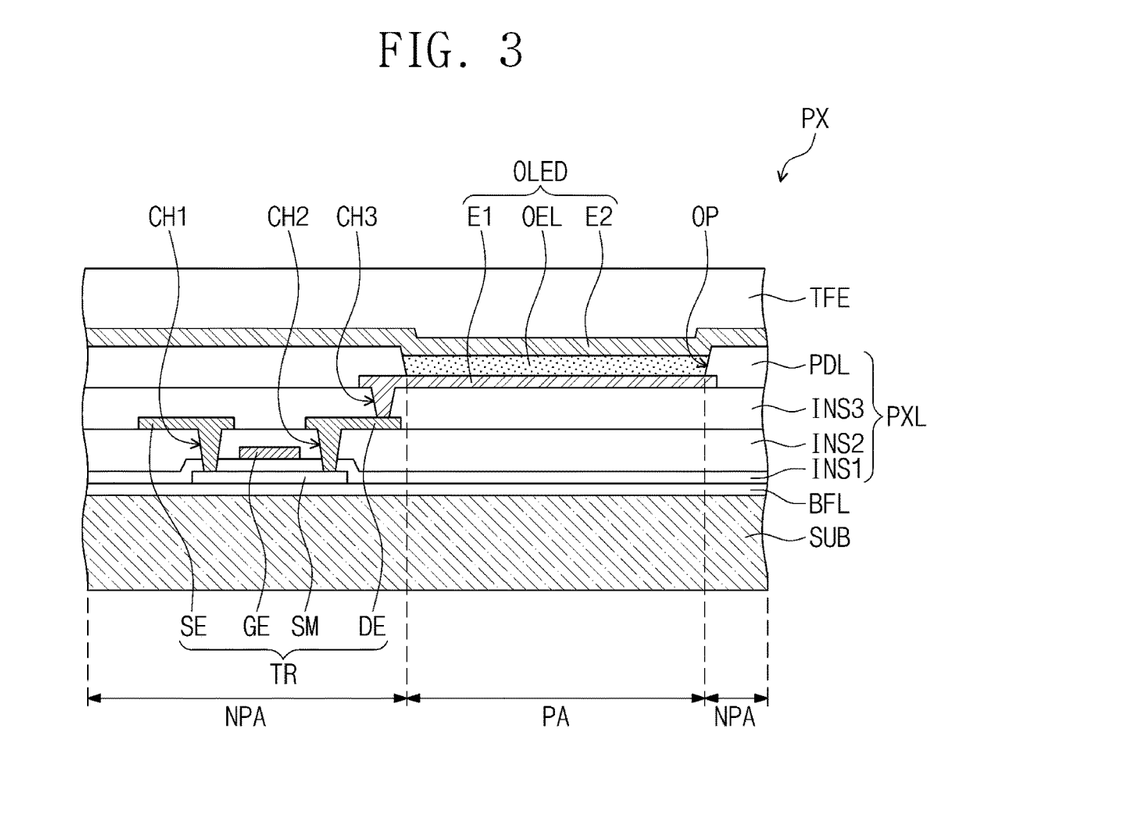
FIG. 3 is an enlarged cross-sectional view of an embodiment of a pixel of the display module in FIG. 2.

FIG. 3 is an enlarged cross-sectional view illustrating an embodiment of a pixel of the display module in FIG. 2. An image may be displayed at the pixel PX by controlling and/or driving of the pixel layer PXL.

Referring to FIG. 3, the pixel PX may include a light emitting element OLED and a transistor TR which is connected to the light emitting element OLED. The pixel PXL may be disposed in the display area DA described above. The light emitting element OLED may include an organic light emitting diode. The transistor TR and the light emitting element OLED may be disposed on the substrate SUB. A layer in which the transistor TR and the light emitting element OLED are disposed may be defined as the pixel layer PXL. The transistor TR may be driven to control the light emitting element OLED. In an embodiment, the light emitting element OLED may be controlled to generate and/or emit light under control of the transistor TR, to display an image.

A buffer layer BFL may be disposed on the substrate SUB, and the buffer layer BFL may contain an inorganic material. In an embodiment, the buffer layer BFL may be omitted.

A semiconductor layer SM of the transistor TR may be disposed on the buffer layer BFL. The semiconductor layer SM may include a semiconductor including or made of an inorganic material such as amorphous silicon or poly-silicon, or an organic semiconductor. Also, the semiconductor layer SM may include an oxide semiconductor. Although not shown in FIG. 3, the semiconductor layer SM may include a source region, a drain region and a channel region which is disposed between the source region and the drain region.

A first insulation layer INS1 may be disposed on the buffer layer BFL to cover the semiconductor layer SM. The first insulation layer INS1 may include an inorganic material. A gate electrode GE of the transistor TR, which overlaps the semiconductor layer SM, may be disposed on the first insulation layer INS1. The gate electrode GE may be disposed to overlap the channel region of the semiconductor layer SM.

A second insulation layer INS2 may be disposed on the first insulation layer INS1 to cover the gate electrode GE. The second insulation layer INS2 may be defined as an interlayer insulation layer. The second insulation layer INS2 may include an organic material and/or an inorganic material.

A source electrode SE and a drain electrode DE of the transistor TR may be spaced apart from each other on the second insulation layer INS2. The source electrode SE may be connected to the source region of the semiconductor layer SM at or through a first contact hole CH1 passing through the first and second insulation layers INS1 and INS2. The drain electrode DE may be connected to the drain region of the semiconductor layer SM at or through a second contact hole CH2 passing through the first and second insulation layers INS1 and INS2.

A third insulation layer INS3 may be disposed on the second insulation layer INS2 to cover the source electrode SE and the drain electrode DE of the transistor TR. The third insulation layer INS3 may be defined as a flattening layer for providing a flat top surface and include an organic material.

A first electrode E1 of the light emitting element OLED may be disposed on the third insulation layer INS3. The first electrode E1 may be connected to the drain electrode DE of the transistor TR at or through a third contact hole CH3 passing through the third insulation layer INS3. The first electrode E1 may be a pixel electrode or an anode electrode.

A pixel defining layer PDL for exposing a predetermined portion of the first electrode E1 may be disposed on the first electrode E1 and the third insulation layer INS3. An opening OP for exposing the predetermined portion of the first electrode E1 may be defined in the pixel defining layer PDL. An area in which the opening OP is defined may be defined as a pixel area PA. A peripheral area of the pixel area PA may be defined as a non-pixel area NPA.

An organic light emitting layer OEL may be disposed on the first electrode E1 and within the opening OP. The organic light emitting layer OEL may include an organic material capable of generating one light among of red, green and blue light. Although the organic light emitting layer OEL may generate one of red, green and blue light, the embodiment of the invention is not limited thereto. In an embodiment, for example, the organic light emitting layer OEL may generate white light through a combination of organic materials respectively or each generating red, green and blue light.

A second electrode E2 may be disposed on the pixel defining layer PDL and the organic light emitting layer OEL. The second electrode E2 may be defined as a common electrode or a cathode electrode. When the display panel DP is a front light emitting type, the first electrode E1 may include a reflective electrode, and the second electrode E2 may include a transparent electrode.

The light emitting element OLED may be disposed in the pixel area PA. The pixel area PA may include the first electrode E1, the organic light emitting layer OEL and the second electrode E2. The first electrode E1 may be a positive electrode that is a hole injection electrode, and the second electrode E2 may be a negative electrode that is an electron injection electrode.

The thin-film encapsulation layer TFE may be disposed on the light emitting element OLED and in the non-pixel area NPA to commonly cover the pixel PX. In particular, the thin-film encapsulation layer TFE may be disposed on the second electrode E2.

A first voltage for allowing the organic light emitting layer OEL to emit light by control of the transistor TR may be applied to the first electrode El, and a second voltage having a polarity opposite to the first voltage may be applied to the second electrode E2. In this case, a hole and an electron, which are injected into the organic light emitting layer OEL, may be coupled to each other to form an exciton. When the exciton is transferred to the ground state, the light emitting element OLED may emit light. The light emitting element OLED may emit red, green and blue light according to flow of an electrical current and display predetermined image information.

Figure 4:
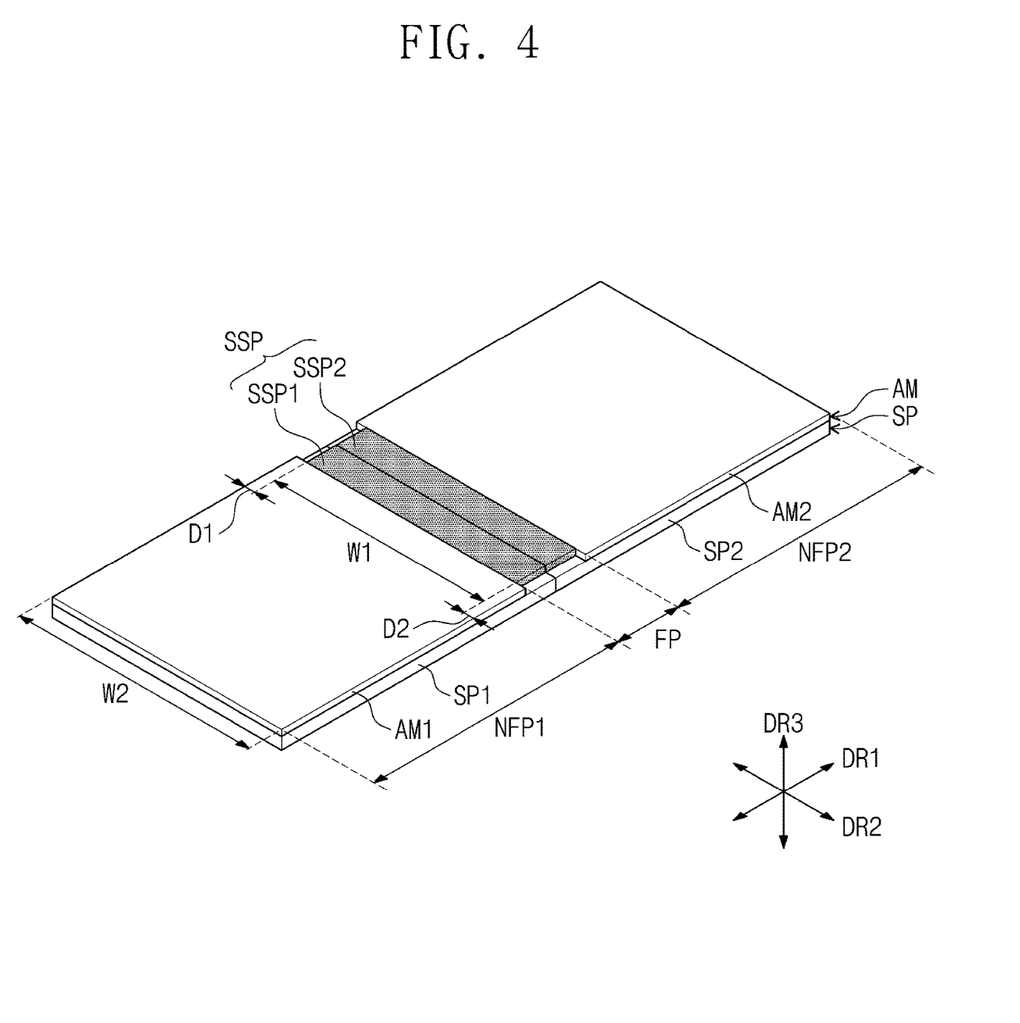
FIG. 4 is a perspective view illustrating an embodiment of a sub-support part of the display device in FIG. 1.
Figure 5:
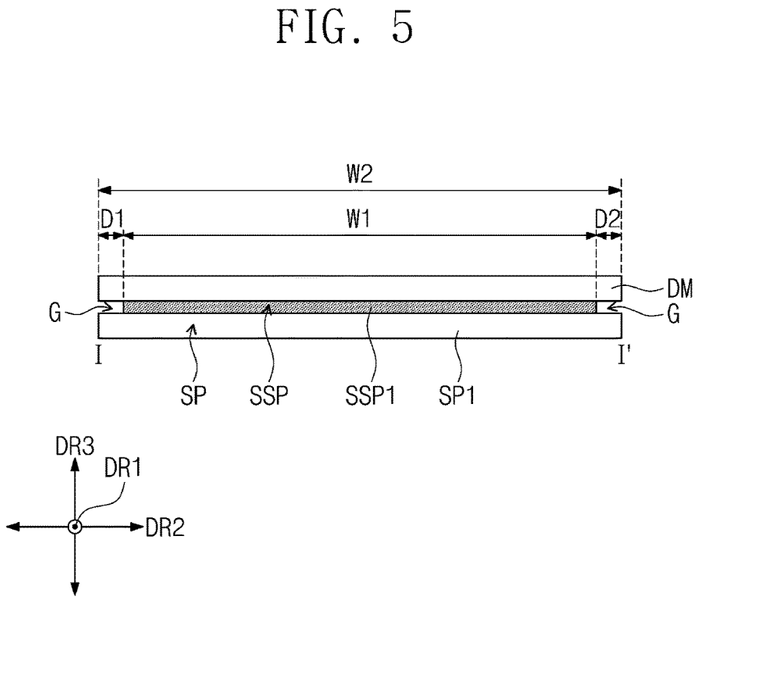
FIG. 5 is a cross-sectional view taken along line I-I' of FIG. 1.

FIG. 4 is a perspective view illustrating an embodiment of a sub-support part disposed below the folding part of the display device in FIG. 1. FIG. 5 is a cross-sectional view taken along line I-I' of FIG. 1.

The display module DM is omitted in FIG. 4 to illustrate a sub-support part SSP. Also, for convenience of description, areas of the folding part FP, the first non-folding part NFP1 and the second non-folding part NFP1 are additionally illustrated by dotted lines in FIG. 4.

Referring to FIGS. 4 and 5, the sub-support part SSP may be disposed between the folding part FP of the display module DM and the support part SP. The sub-support part SSP may be disposed in the gap formed between the first and second adhesives AM1 and AM2 at the folding part FP. Also, the sub-support part SSP may be disposed between the first adhesive AM1 and the second adhesive AM2. The sub-support part SSP may have an overall rectangular shape having relatively short sides lengthwise extended in the first direction DR1 and relatively long sides lengthwise extended in the second direction DR2

A bottom surface of the sub-support part SSP, which faces the support part SP, may be attached to the support part SP. A top surface of the sub-support part SSP, which faces the display module DM, may not be attached to the display module DM. A feature in which the top surface of the sub-support part SSP is not attached to the display module DM will be described below in detail with reference to FIG. 6.

When an empty space is defined below the folding part FP, since the first and second adhesives AM1 and AM2 are disposed only below the first and second non-folding parts NFP1 and NFP2, a stepped portion may be defined below or at respective boundaries between the folding part FP, and each of the first and second non-folding parts NFP1 and NFP2. The sub-support part SSP may be disposed below the folding part FP to compensate the above-described stepped portion.

A width of the sub-support part SSP, which is defined as a distance between opposing edges or sides of the sub-support part SSP in the second direction DR2, may be defined as a first width W1. A width of the display module DM, which is defined as a distance between opposing edges or sides of the display module DM in the second direction DR2, may be defined as a second width W2. The support part SP may have the second width W2 in the second direction DR2 such that the width of the support part SP is equal to that of the display module DM. The first width W1 may be less than the second width W2. Each of the above-described widths may be a maximum dimension of the respective component, taken in the second direction DR2.

When viewed along the first direction DR1, such as the view illustrated in FIG. 5, the opposing sides of the sub-support part SSP may not overlap opposing edges or sides of the folding part FP. Also, when viewed from the first direction DR1, the opposing sides of the sub-support part SSP may not overlap opposing edges or sides of the support part SP. As not overlapping, edges or side are not aligned with each other and may be offset from each other.

Since the first width W1 of the sub-support part SSP is less than each of the second width W2 of the folding part FP and the second width W2 of the support part SP, and the opposing sides of the sub-support part SSP do not overlap the both sides of the folding part FP and the opposing sides of the support part SP, as illustrated in FIG. 5, a groove G may be defined at the opposing sides of the folding part FP, respectively.

When viewed along the first direction DR1, a groove G may be defined between a first side of the folding part FP of the display module DM and a first side of the support part SP which overlaps the folding part FP, where the first edges are disposed at a same side of the display device DD. A groove G may also be defined between a second side of the folding part FP opposite to the first side thereof and a second side of the support part SP opposite to the first side thereof which overlaps the folding part FP, where the second edges are disposed at a same side of the display device DD. The grooves G may be formed since an outer edge of the sub-support part SSP is offset from outer edges of the display module DM and the support part SP. The groove G may be extended along the first and second directions DR1 and DR2.

In the second direction DR2, a distance between the first side of the sub-support part SSP and the first side of the folding part FP may be defined as a first distance D1. In the second direction DR2, a distance between the second side of the sub-support part SSP, which is opposite to the first side of the sub-support part SSP, and the second side of the folding part FP may be defined as a second distance D2.

In an embodiment, for example, the first distance D1 may be equal to the second distance D2. However, the invention is not limited thereto. In another embodiment, for example, the first distance D1 may be different from the second distance D2. A ratio between the second width W2 and the first width W1 may be about 1:0.9, more preferably, about 1:0.936 to 0.973. However, the invention is not limited thereto. Also, a ratio between the second width W2 and the first distance D1 (or second distance D2) may be about 1:0.01 to 0.03, more preferably, about 1:0.013 to 0.032. However, the invention is not limited thereto. In an embodiment, for example, the second width W2 may be about 110 millimeters (mm), each of the first and second distances D1 and D2 may be about 1.5 mm to about 3.5 mm, and the first width W1 may be about 103 mm to about 107 mm.

In the third direction DR3, the sub-support part SSP may have a thickness less than that of the display module DM. Here, a thickness may be defined as a distance between a top surface and a bottom surface of a corresponding component with respect to the third direction DR3. The thickness of a respective component may be a maximum dimension of the component along the third direction DR3. In an embodiment, for example, the sub-support part SSP may have a thickness of about 25 micrometers ($\mu$m), and the display module DM may have a thickness greater than that of the sub-support part SSP.

The sub-support part SSP may include a first sub-support part (or member) SSP1 disposed between the first adhesive AM1 and the second adhesive AM2, and a second sub-support part (or member) SSP2 disposed between the first sub-support part SSP1 and the second adhesive AM2

A boundary between the first sub-support part SSP1 and the second sub-support part SSP2 may overlap a central portion of the folding part FP. However, the invention is not limited thereto. In an embodiment, for example, the boundary between the first sub-support part SSP1 and the second sub-support part SSP2 may overlap another predetermined portion of the folding part FP which is offset from the central portion thereof.

As illustrated in FIG. 4, each of the first and second sub-support parts SSP1 and SSP2 may have an overall rectangular shape having relatively short sides lengthwise extended in the first direction DR1 and relatively long sides lengthwise extended in the second direction DR2. As illustrated in FIG. 5, when viewed along the first direction DR1, a cross-section of the first sub-support part SSP1 may have an overall rectangular shape having relatively long sides lengthwise extended in the second direction DR2 and relatively short sides lengthwise extended in the third direction DR3.

Although the rectangular shaped cross-section of the first sub-support part SSP1 is illustrated in FIG. 5, the second sub-support part SSP2 may also have the same shape and side orientations as the first sub-support part SSP1 described above.

The first support part SP1 may be disposed below the first adhesive AM1 and the first sub-support part SSP1. The second support part SP2 may be disposed below the second adhesive AM2 and the second sub-support part SSP2.

Figure 6:
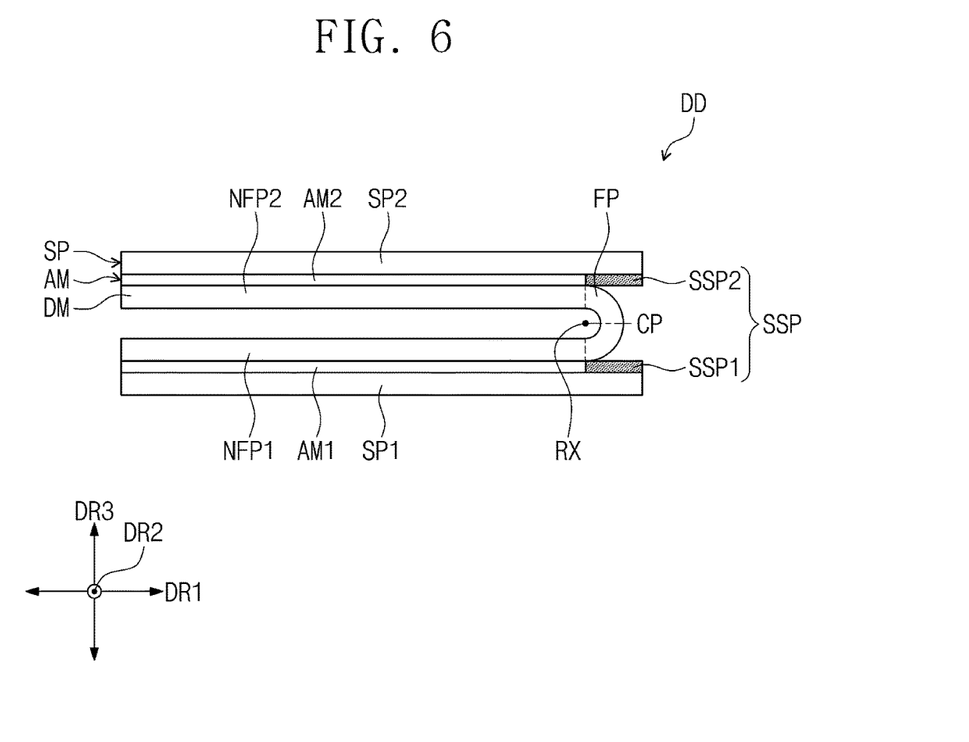
FIG. 6 is a cross-sectional view illustrating an embodiment of the display device in FIG. 1 in which the display device is folded.

FIG. 6 is a cross-sectional view illustrating an embodiment of the display device in FIG. 1 in which the display device is folded.

Referring to FIG. 6, the display device DD may be folded with respect to the rotation axis RX that overlaps the central portion CP of the folding part FP and is parallel to the second direction DR2. The display module DM may be in-folded so that the display surface of the display module faces an inner area of the display device DD which is folded and is not exposed to or directed toward outside the display device DD which is folded. Accordingly, when the display module DM is folded, the first non-folding part NFP1 and the second non-folding part NFP2 may face each other across the inner area of the display device DD which is folded.

When the display module DM is folded, the first support part SP1 and the second support part SP2 may be separated from each other along the first direction DR1 within the plane of the display module DM. Also, when the display module DM is folded, the first sub-support part SSP1 and the second sub-support part SSP2 may be separated from each other along the first direction DR1 within the plane of the display module DM.

The first and second sub-support parts SSP1 and SSP2 may be respectively attached to the first and second support parts SP1 and SP2, and may not be attached to the folding part FP of the display module DM. That is, the first and second sub-support parts SSP1 and SSP2 may be movable together with the first and second support parts SP1 and SP2, respectively. In contrast, the first and second sub-support parts SSP1 and SSP2 are movable independently from the folding part FP.

Accordingly, when the display module DM is folded, the first and second sub-support parts SSP1 and SSP2 may be separated from the folding part FP. In contrast, when the first and second sub-support parts SSP1 and SSP2 are attached to the folding part FP, the display module DM may not be normally folded.

Although not shown, an adhesive for attaching the first and second sub-support parts SSP1 and SSP2 to the first and second support parts SP1 and SP2 may be disposed on a surfaces of the first and second sub-support parts SSP1 and SSP2, which face the first and second support parts SP1 and SP2, respectively.

Figure 7:
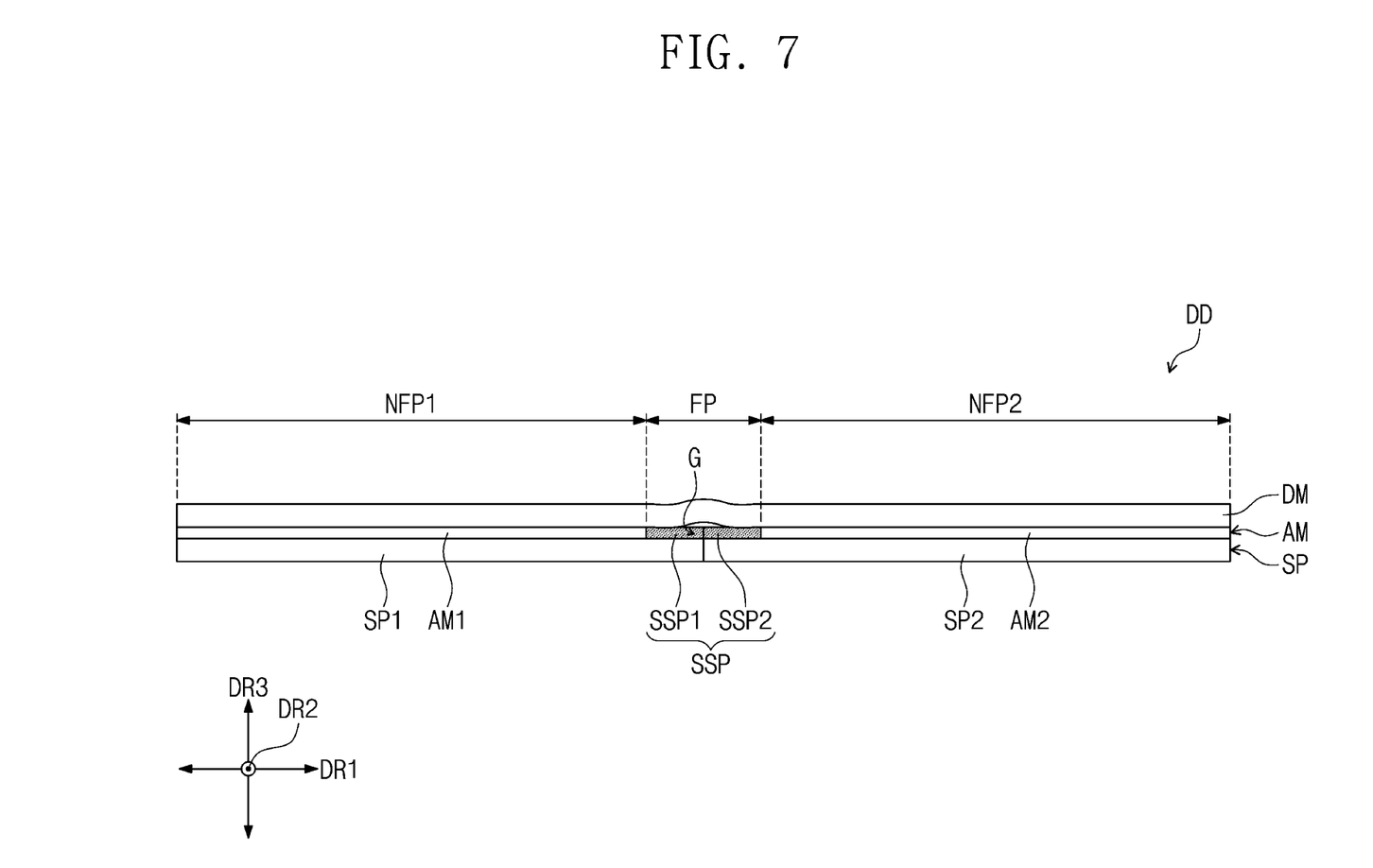
FIG. 7 is a cross-sectional view illustrating an embodiment of the display device in FIG. 6 in which the folded display device is unfolded.
Figure 8:
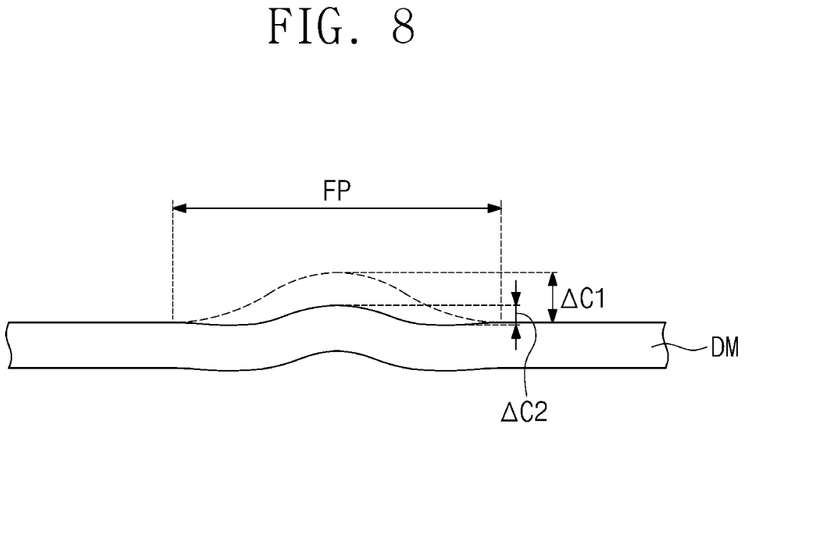
FIG. 8 is an enlarged cross-sectional view illustrating an embodiment of a folding part of a display panel of the display device in FIG. 7.

FIG. 7 is a cross-sectional view illustrating an embodiment of the display device in FIG. 6 in which the display device is folded. FIG. 8 is an enlarged cross-sectional view illustrating an embodiment of the folding part of the display device in FIG. 7. Particularly, FIG. 8 is a view along the second direction DR2 of one of the opposing ends of the folding portion FP at the groove G.

Referring to FIGS. 7 and 8, when the display module DM is folded and unfolded in a repeated manner, the folding part FP may be deformed with respect to an initial shape thereof. In an embodiment, for example, the folding part FP of the flexible display module DM may be deformed by being stretched relative to an original dimension thereof, and such a phenomenon may undesirably extend further than the outer sides of the folding part FP and into other portions of the display module DM.

A side surface (e.g., end side surface) of the folding part FP at which the display device DD is viewed in FIG. 8 may be one side surface among opposing side surfaces of the folding part FP along the second direction DR2, and an opposite side surface of the folding part FP which is opposite to that viewable in FIG. 8 may be also deformed in the same manner as the one side surface of the folding part FP in FIG. 8. Thus, hereinafter, deformation of one side surface of the folding part in FIG. 8 will be described. One side surface of the folding part FP may correspond to one side of the folding part FP, and, hereinafter, the one side of the folding part FP may refer to the one side surface of the folding part FP.

Unlike the structure of the outer side surfaces illustrated in FIG. 5, the sub-support part SSP may extend to the opposing sides of the folding part FP. In this case, the opposing sides of the sub-support part SSP overlap (e.g., are aligned with) the opposing sides of the folding part FP, and the grooves G in FIG. 5 are not defined.

When one side of the folding part FP is stretched such as by repeated folding and unfolding, and the grooved G in FIG. 5 are not defined as described above, the stretched one side of the folding part FP may be lifted upward in a direction away from underlying layers of the display device DD. The upward lifted one side of the folding part FP is expressed as a dotted line in FIG. 8. Hereinafter, the folding part FP having the upward lifted one side defines a first deformation state of the folding part FP.

In one or more embodiment of the invention, the display device DD which is unfolded defines the grooves G below the opposing sides of the folding part FP. Accordingly, when one side of the folding part FP is stretched such as by repeated folding and unfolding, and the grooves G in FIG. 5 are defined below the opposing sides of the folding part FP, portions of the folding part FP which are closest to the first and second non-folding parts NFP1 and NFP2, among portions of the stretched one side of the folding part FP may be recessed downward toward the grooves G, and a central portion of the one side of the folding part FP may be lifted upward. The downward recessed portions and the upward lifted central portion of the folding part FP is expressed as a solid line in FIG. 7 and FIG. 8. Hereinafter, the closest portion portions of the folding part FP to the first and second non-folding parts NFP1 and NFP2 and the central portion of the folding part FP lifted upwards defines a second deformation state of the folding part FP.

The first deformation state may have a first deformation amount $\Delta C1$, and the second deformation state may have a second deformation amount $\Delta C2$. The deformation amount may be defined as a distance between a minimum point and a maximum point in the deformation of the folding part FP. The second deformation amount $\Delta C2$ (from the grooves G defined below the opposing sides of the folding part FP) may be less than the first deformation amount $\Delta C1$ (from the grooves G not defined). A minimum point of deformation may be a reference plane in which the display module DM is flat, such as illustrated by the leftmost and rightmost flat portions in FIG. 8 from which each of $\Delta C1$ and $\Delta C2$ are measured.

A reason of the first deformation state having the first deformation amount $\Delta C1$ is as stated below. As discussed above, where the opposing sides of the sub-support part SSP overlap (e.g., are aligned with) the opposing sides of the folding part FP, the grooves G in FIG. 5 are not defined. Since the grooves G are not defined below the both sides of the folding part FP, and the sub-support part SSP is disposed therebelow, the stretched one side of the folding part FP is lifted upward instead of being recessed downward due to the sub-support part SSP.

However, in one or more the embodiment of the invention, since the stretched one side of the folding part FP may be recessed downward toward the groove G, the second deformation state may have the second deformation amount $\Delta C2$ that is less than the first deformation amount $\Delta C1$. As the deformation amount of the folding part FP increases, possibility of the deformation of the folding part FP being seen by a user may increase. Since the second deformation amount $\Delta C2$ is less than the first deformation amount $\Delta C1$, the possibility of the deformation of the folding part FP being seen by the user may advantageously decrease.

As a result, the display device DD according to one or more the embodiment of the invention may reduce the deformation amount of the folding part FP by defining the grooves G below the opposing sides of the folding part FP of the display module DM. Thus, the possibility of the deformation of the folding part FP to be seen to the user may extremely decrease.

FIGS. 9 to 12 are views illustrating various other embodiments of a sub-support part of a display device according to the invention.

Hereinafter, components of sub-support parts SSP_1 to SSP_4 in FIGS. 9 to 12, which are different from those of the sub-support part SSP in FIGS. 4 and 5, will be mainly described, and the same components will be indicated by the same reference numerals. For convenience of description, cross-sectional views corresponding to FIG. 5 are illustrated in FIGS. 9 to 12.

Figure 9:
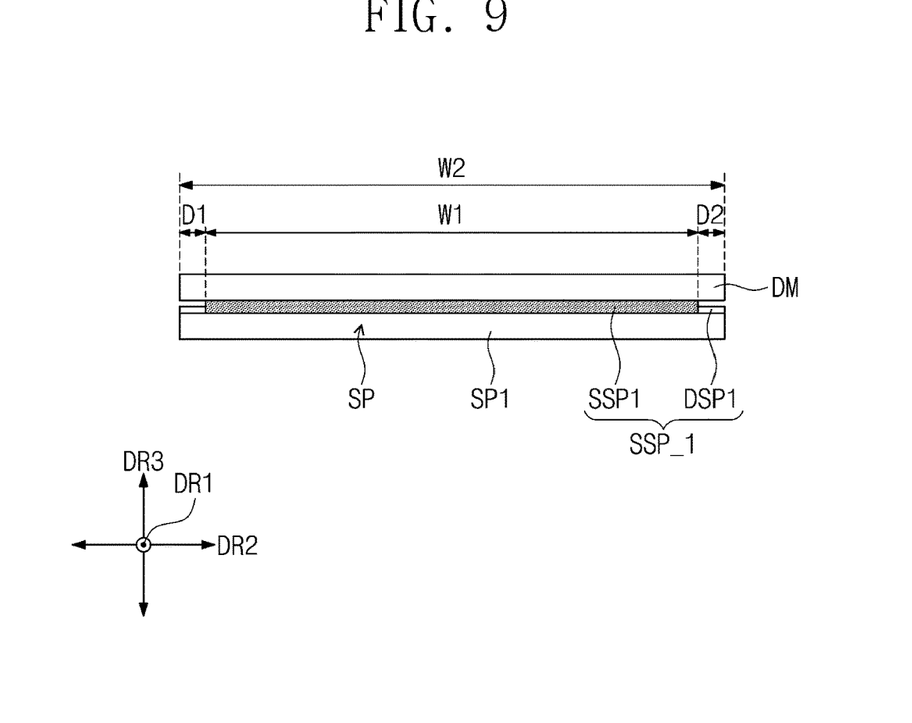
FIGS. 9 to 12 are views illustrating various other embodiments of a sub-support part of a display device according to the invention.
Figure 10:
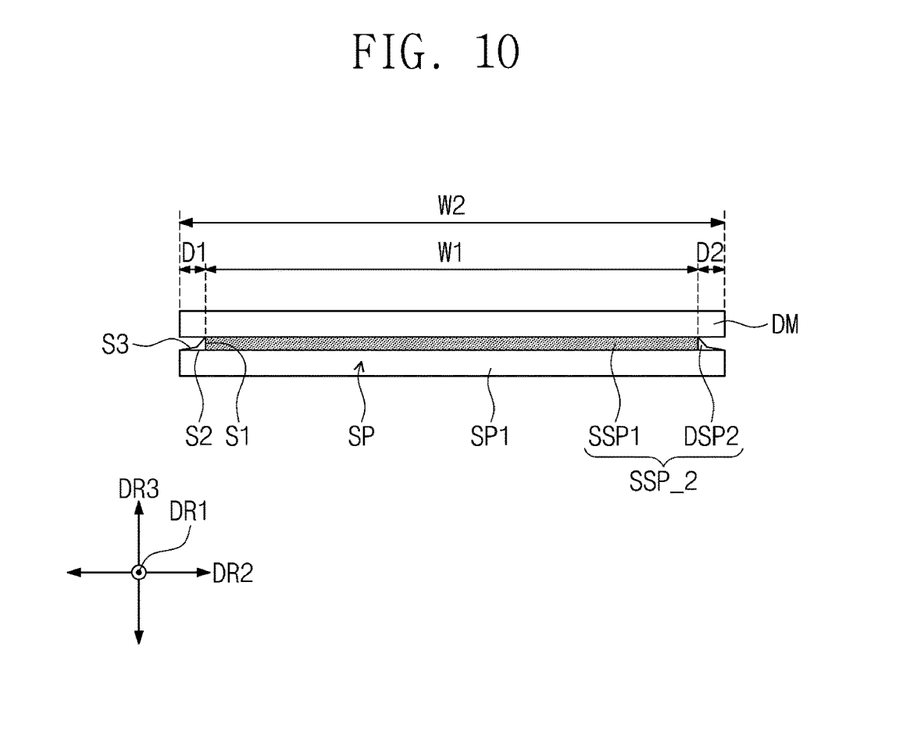
Figure 11:
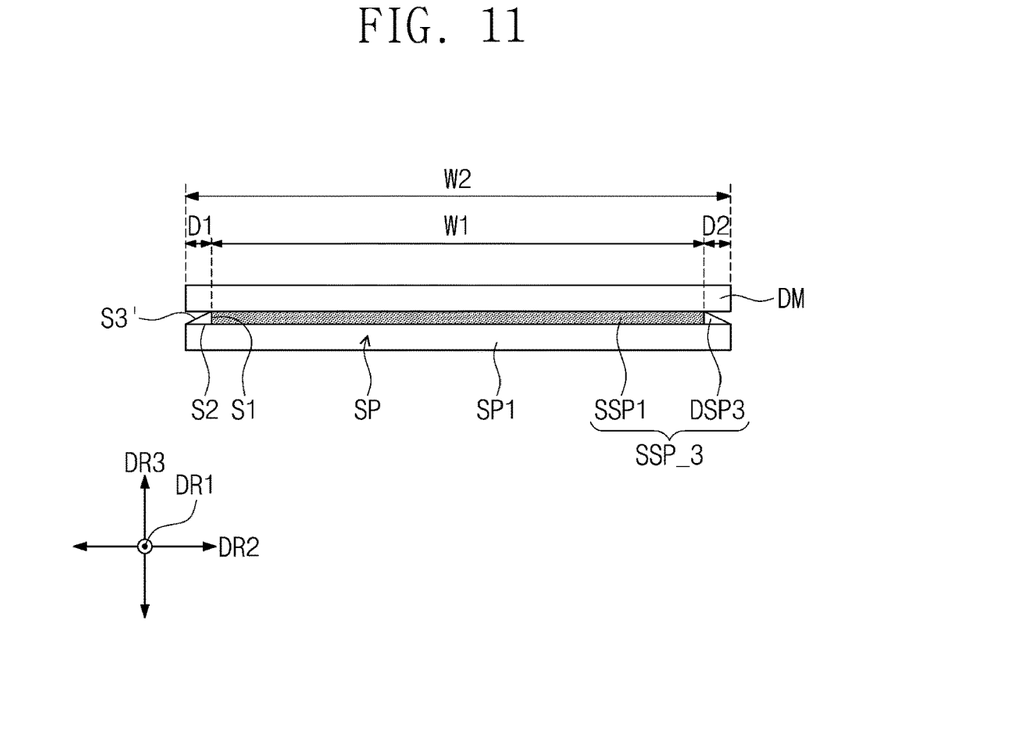

Although FIGS. 9 to 11 are cross-sectional views corresponding to FIG. 5 in which the first sub-support part SSP1 is illustrated, substantially, the sub-support parts SSP_1 to SSP_3 may include a second sub-support part SSP2. Such second sub-support part SSP2 of sub-support parts SSP_1 to SSP_3 may have the same structure as the first sub-support part SSP1 illustrated for sub-support parts SSP_1 to SSP_3 in FIGS. 9 to 11.

Referring to FIG. 9, the sub-support part SSP_1 may include a first sub-support part SSP1 and a plurality of dummy support parts DSP1. The first sub-support part SSP1 is the same as the first sub-support part SSP1 in FIGS. 4 and 5, description will be omitted below.

The dummy support parts DSP1 may be disposed at opposing sides of the first sub-support part SSP1, respectively, when viewed along the first direction DR1. Each of the dummy support parts DSP1 may have an overall rectangular shape in cross-section. Each of the dummy support parts DSP1 may have a rectangular shape in the top plan view, that is, extending in the first and second directions DR1 and DR2, without being limited thereto. With respect to the third direction DR3, each of the dummy support parts DSP1 may have a thickness less than that of the first sub-support part SSP1.

Although not shown, since the dummy support parts DPS1 may be disposed at both of the opposing sides of the second sub support part SSP2, the dummy support parts DSP1 may have a thickness less than that of the second sub support part SSP2.

Referring to FIG. 10, the sub-support part SSP_2 may include a first sub-support part SSP1 and a plurality of dummy support parts DSP2. The dummy support parts DSP2 may be disposed at opposing sides of the first sub-support part SSP1, respectively.

When viewed along the first direction DR1, each of the dummy support parts DSP2 may include first and second sides S1 and S2, which form a right angle, and an oblique side that connects distal ends of the first and second sides S1 and S2 and faces the right angle. At each opposing side of the first sub-support part SSP1, the first and second sides S1 and S2 of the dummy support parts DSP2 may contact the opposing side of the first sub-support part SSP1 and the first support part SP1, respectively. The oblique side S3 may have a bent or curved shape at a predetermined portion thereof.

Although not shown, the dummy support parts DSP2 may be disposed at opposing sides of the second sub-support part SSP2, respectively. At each opposing side of the second sub-support part SSP2, the first and second sides Si and S2 of the dummy support parts DSP2 may contact the opposing side of the second sub-support part SSP2 and the second support part SP2, respectively.

Referring to FIG. 11, the sub-support part SSP_3 may include a first sub-support part SSP1 and a plurality of dummy support parts DSP3. The dummy support parts DSP3 may be disposed at opposing sides of the first sub-support part SSP1, respectively.

When viewed along the first direction DR1, each of the dummy support parts DSP3 may have a right triangle shape. At each opposing side of the first sub-support part SSP1, first and second sides S1 and S2 of the dummy support parts DSP3 may contact the opposing side of the first sub-support part SSP1 and the first support part SP1, respectively.

Although not shown, the dummy support parts DSP3 may be disposed at opposing sides of the second sub-support part SSP2, respectively. At each opposing side of the second sub-support part SSP2, the first and second sides Si and S2 of the dummy support parts DSP3 may contact the opposing side of the second sub-support part SSP2 and the second support part SP2, respectively. An oblique side S3', which faces the right angle, may have a linear shape without being bent or curved, unlike the oblique side S3 in FIG. 10.

Figure 12:
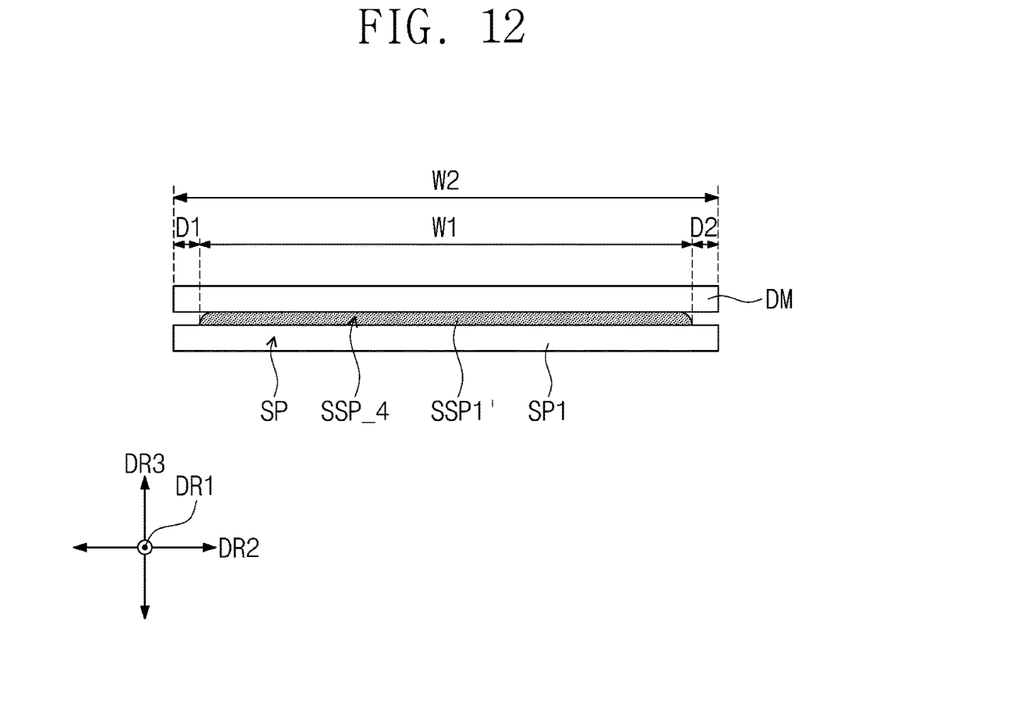

Referring to FIG. 12, the sub-support part SSP_4 may include a first sub-support part SSP1'. At each opposing side of the first sub-support part SSP1, the first sub-support part SSP1' may have a width in the second direction DR2, which gradually decreases from a bottom surface to a top surface of the first sub-support part SSP1'.

When viewed along the first direction DR1, each of the opposing sides of the first sub-support part SSP1' may have a curved shape. Although not shown, the sub-support part SSP_4 may include a second sub-support part having the same shape as the first sub-support part SSP1' and disposed between the first sub-support part SSP1' and the second adhesive AM2.

The display device according to one or more embodiment of the invention may reduce the deformation amount of the folding part of a display module by defining the predetermined grooves below the display module at opposing sides of the folding part of the display module.

Although the exemplary embodiments of the invention have been described, it is understood that the invention should not be limited to these exemplary embodiments but various changes and modifications can be made by one ordinary skilled in the art within the spirit and scope of the invention as hereinafter claimed. Thus, to the maximum extent allowed by law, the scope of the invention is to be determined by the broadest permissible interpretation of the following claims and their equivalents, and shall not be restricted or limited by the foregoing detailed description.

What is claimed is:

1. A display device comprising:
    a display module comprising a plurality of non-folding portions which are arranged along a first direction, and a folding portion which is disposed between the non-folding portions and at which the display module is folded;
    a support part disposed facing each of the non-folding portions and the folding portion of the display module;
    an adhesive disposed between the support part and each of the non-folding portions of the display module, respectively; and
    a sub-support part disposed between the folding portion and the support part,
    wherein along a second direction crossing the first direction, a first width of the sub-support part is less than a second width of the display module.

2. The display device of claim 1, wherein along the second direction, opposing ends of the sub-support part are spaced apart from respective corresponding opposing ends of the display module at the folding portion thereof.

3. The display device of claim 1, wherein along the second direction,
    the sub-support part defines a first end and a second end which is opposite to the first end,
    the display module at the folding portion thereof defines a first end and a second end respectively corresponding to the first end and the second end of the sub-support part,
    the first end of the sub-support part is spaced apart from the first end of the display module at the folding portion thereof by a first distance, the second end of the sub-support part is spaced apart from the second end of the display module at the folding portion thereof by a second distance, and
the first distance is equal to the second distance.

4. The display device of claim 3, wherein
a ratio between the second width and the first width is about 1:0.9, and
a ratio between the second width and the first distance is about 1:0.01 to about 0.03.

5. The display device of claim 1, wherein along the second direction,
the sub-support part defines a first end and a second end which is opposite to the first end,
the display module at the folding portion thereof defines a first end and a second end respectively corresponding to the first end and the second end of the sub-support part,
the first end of the sub-support part is spaced apart from the first end of the display module at the folding portion thereof by a first distance,
the second end of the sub-support part is spaced apart from the second end of the display module at the folding portion thereof by a second distance, and
the first distance is different from the second distance.

6. The display device of claim 1, wherein
the non-folding portions of the display module comprise a first non-folding portion and a second non-folding portion which are arranged in the first direction, and
the adhesive comprises a first adhesive disposed between the first non-folding portion and the support part, and a second adhesive disposed between the second non-folding portion and the support part, the second adhesive being disconnected from the first adhesive to define a gap therebetween.

7. The display device of claim 6, wherein the sub-support part comprises in the gap defined between the first adhesive and the second adhesive:
a first sub-support part disposed between the first adhesive and the second adhesive; and
a second sub-support part disposed between the first sub-support part and the second adhesive.

8. The display device of claim 7, wherein along the first direction, a boundary between the first sub-support part and the second sub-support part corresponds to a central portion of the folding portion of the display module.

9. The display device of claim 7, wherein the support part comprises:
a first support part facing each of the first adhesive and the first sub-support part; and
a second support part facing each of the second adhesive and the second sub-support part.

10. The display device of claim 9, wherein
the first adhesive attaches the first non-folding portion of the display module to the first support part, and
the second adhesive attaches the second non-folding portion of the display module to the second support part.

11. The display device of claim 9, wherein
the first sub-support part is attached to the first support part to be movable together with the first support part, and
the second sub-support part is attached to the second support part to be movable together with the second support part.

12. The display device of claim 9, wherein
the display module is foldable at the folding portion thereof, with respect to a rotation axis parallel to the second direction and disposed corresponding to the folding portion, and
the display module folded at the folding portion, about the rotation axis:
disposes the non-folding portions of the display module facing each other,
separates the first support part and the second support part from each other at the folding portion of the display module,
separates the first sub-support part and the second sub-support part from each other at the folding portion of the display module, and
separates both of the first and second sub-support parts from the folding portion of the display module.

13. The display device of claim 7, wherein the first and second sub-support parts are detachably connected to the folding portion of the display module to be separable from the folding portion.

14. The display device of claim 7, wherein each of the first and second sub-support parts includes first sides lengthwise extended in the first direction and second sides lengthwise extended in the second direction, lengths of the second sides being greater than lengths of the first sides.

15. The display device of claim 7, wherein
along the second direction,
each sub-support part among the first and second sub-support parts defines a first end and a second end which is opposite to the first end,
the display module at the folding portion thereof defines a first end and a second end respectively corresponding to the first end and the second end of the each sub-support part, and
the first and second ends of the each sub-support part are respectively spaced apart from the corresponding first and second ends of the display module to define grooves between the folding portion of the display module and the support part respectively at each of the first and second ends of the sub-support part, and
the display device further comprises a plurality of dummy support parts respectively disposed in the grooves.

16. The display device of claim 15, wherein in a third direction crossing a plane defined by the first and second directions, a thickness of each of the dummy support parts is less than a thickness of the each sub-support part.

17. The display device of claim 15, wherein in a cross-section viewed along the first direction, each dummy support part among the dummy support parts comprises:
a first side and a second side which forms a right angle with the first side; and
an oblique side which connects ends of the first and second sides to each other and faces the right angle, the oblique side having a curved shape,
wherein the first and second sides of the each dummy support part contact the each sub-support part and the support part, respectively.

18. The display device of claim 15, wherein in a cross-section viewed along the first direction, each dummy support part among the dummy support parts has a right triangle shape including:
a first side and a second side which forms a right angle with the first side; and
an oblique side which connects ends of the first and second sides to each other and faces the right angle, wherein the first and second sides of the each dummy support part contact the each sub-support part and the support part, respectively.

19. The display device of claim 7, wherein
along the second direction, each sub-support part among the first and second sub-support parts has a width that gradually decreases in a direction from the support part toward the display module, and
in a cross-section viewed along the first direction, each of opposing side surfaces of the each sub-support part has a curved shape to define the width that gradually decreases in the direction from the support part toward the display module.

20. A display device comprising:
a display module comprising a plurality of non-folding portions arranged along a first direction, and a folding portion which is disposed between the non-folding portions and at which the display module is folded;
a support part disposed facing each of the non-folding portions and the folding portion of the display module;
an adhesive disposed between the support part and each of the non-folding portions, respectively; and
a sub-support part disposed between the folding portion and the support part,
wherein along a second direction crossing the first direction,
the sub-support part defines a first end and a second end which is opposite to the first end,
the display module at the folding portion thereof defines a first end and a second end respectively corresponding to the first end and the second end of the sub-support part, and
the first and second ends of the sub-support part are respectively spaced apart from the corresponding first and second ends of the display module at the folding portion thereof to define grooves between the folding portion of the display module and the support part respectively at each of the first and second ends of the sub-support part.

* * * * *